June 15, 1965 G. BRUCK 3,189,843

MULTIPLE TUNNEL DIODE RESONANT CAVITY OSCILLATOR

Filed Aug. 29, 1962 2 Sheets-Sheet 1

INVENTOR.
GEORGE BRUCK.
BY Alden D. Redfield
Charles M. Hogan.
ATTORNEYS.

MULTIPLE TUNNEL DIODE RESONANT CAVITY OSCILLATOR

Filed Aug. 29, 1962 2 Sheets-Sheet 2

INVENTOR.
GEORGE BRUCK.
BY Alden D. Redfield
Charles M. Hogan
ATTORNEYS.

3,189,843
MULTIPLE TUNNEL DIODE RESONANT CAVITY OSCILLATOR

George Bruck, Cincinnati, Ohio, assignor to Avco Corporation, Cincinnati, Ohio, a corporation of Delaware
Filed Aug. 29, 1962, Ser. No. 220,275
6 Claims. (Cl. 331—107)

The present invention relates to solid state microwave generators, and it provides, specifically, a multiple tunnel diode oscillator.

It is generally considered in the art that transistors cannot operate at microwave frequencies, so that it has become customary to generate power at a frequency below 100 megacycles and to apply the generated power to a varactor multiplier. The conventional system just outlined is complicated, critical in adjustment, and susceptible to impairment by nuclear radiation. Additionally, it lacks efficiency and is too cumbersome for ready application in space technology. While tunnel diodes are resonably free from the effects of nuclear radiation, their power output is limited, and their geometry and design are currently such that the art considers them inadequate to handle power at microwave frequencies.

Contrary to this established thinking in the art, a primary object of the invention is to provide a multiple tunnel diode oscillator so arranged that the power outputs of a plurality of tunnel diodes sum consistently to provide medium microwave power, on the order of one-half watt or more.

Another object of the invention is to provide a relatively nuclear radiation-proof microwave power generator.

A further object of the invention is to provide a multiple tunnel diode oscillator in which the several tunnel diodes are energized by a single junction thermoelectric generator.

Still another object of the invention is to provide a periodic structure excited by tunnel diodes in such a manner that the output powers of such diodes sum consistently.

In accordance with the invention, there is provided, for example, a microwave oscillator (FIG. 1) comprising, in combination: a master cavity resonator 10; a plurality of radially extending resonators 11, 12 etc., coupled (as by slots 13) to said master cavity resonator; and a plurality of tunnel diodes 14, 15, etc., for exciting the radially extending resonators.

In accordance with one specific embodiment of the invention, the tunnel diodes are energized by a single centrally positioned thermoelectric generator 16.

For a better understanding of the present invention, together with other and further objects, advantages, and capabilities thereof, reference is made to the following description of the accompanying drawings, in which.

Figure 1:
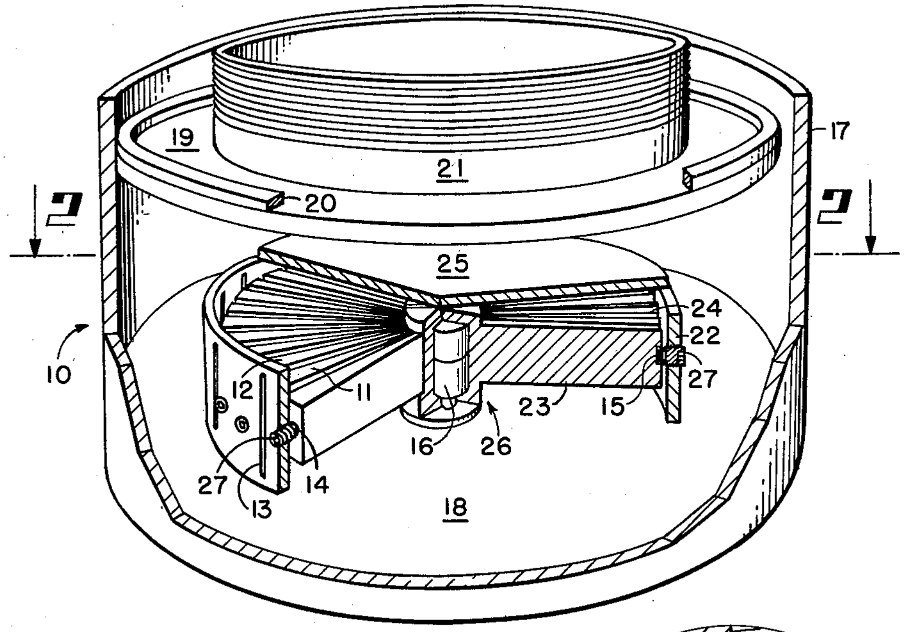
FIG. 1 is a perspective view, generally frontal but partially illustrative of the top, of a preferred embodiment of multiple tunnel diode microwave oscillator in accordance with the invention, certain sections being broken away to aid in the description and understanding of the invention.
Figures 2, 3, 4:
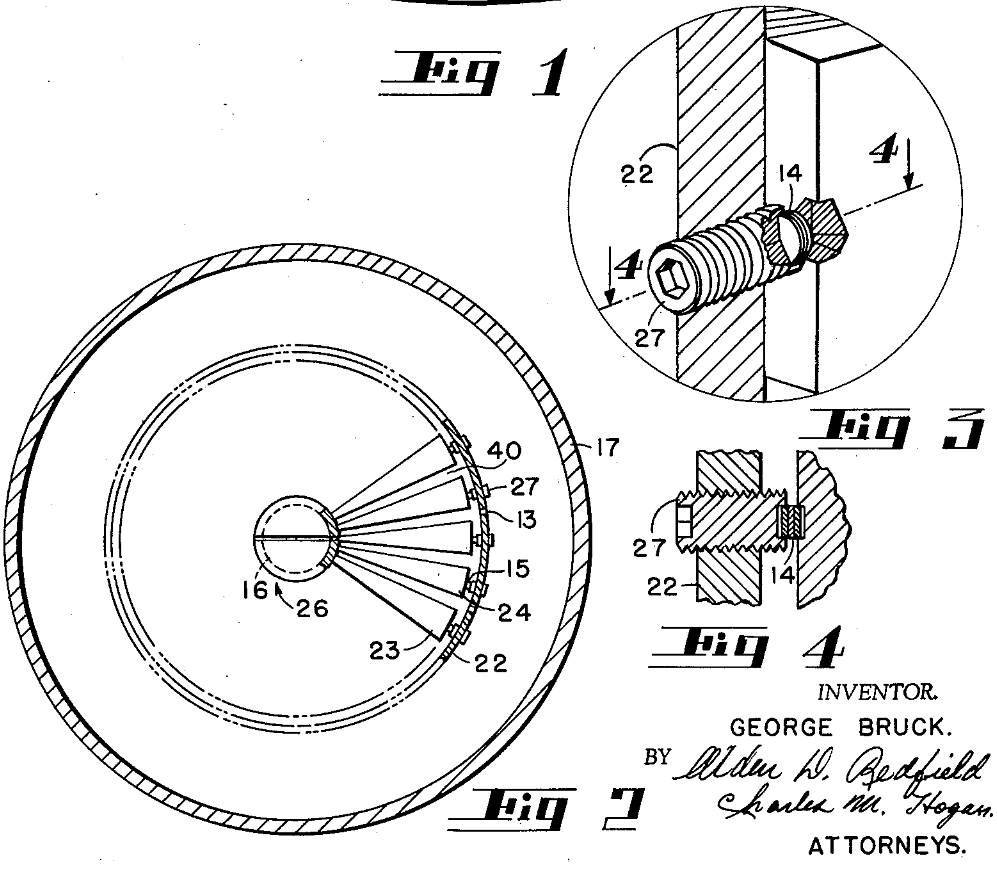
FIG. 2 is a sectional view in plan, taken along the section line 2—2 of FIG. 1 and looking in the direction of the arrows.
FIG. 3 is an exploded view of the circled tunnel diode area of FIG. 1.
FIG. 4 is a sectional view taken along section line 4—4 of FIG. 3, looking in the direction of the arrows.

Referring now specifically to FIGS. 1–4, there is illustrated a master cavity resonator 10. This resonator is in the form of a housing comprising a cylindrical outer wall 17 and a circular bottom 18 made of a suitable non-magnetic material such as silver-plated brass or copper, or Invar. The cavity is closed by a disc-like plunger 19 which is slidably adjustably positioned, for purposes of tuning, within the upper portion of outer wall 17. An annular washer 20 of lossy dielectric material is fixed atop the disc 19 and in close sliding relationship to inner wall 17 to prevent R.F. losses. The plunger 19 is suitably apertured and provided with a fitting or mechanical coupler 21, which is suitably connected to a power take-off device (not shown).

Disposed within the master resonator and extending from the bottom 18 toward (but not to) the disc 19 is a concentric partition 22. An even-numbered plurality of radially extending cavity resonators is provided by an even-numbered plurality of metallic spoke-like wings 23, 24, etc., extending radially outwardly from the central area toward the partition 22. These wings terminate radially short of the partition and are of lesser height than the partition, so that the partition has upper and lower margins extending above and below the wings. The chamber for the plurality of radially extending resonators is closed by a circular cap member 25 in abutment with the top edge of partition 22.

The wings project outwardly from a small central cylinder generally indicated by the reference numeral 26, formed in two semi-cylindircal portions in such manner as to house a single junction thermoelectric generator 16, which provides power for all of the tunnel diodes in the assembly.

Alternate ones of the radially extending resonators are coupled to the master cavity resonator as by vertically extending slots 13 formed in partition 22.

The radially extending resonators are energized by an even-numbered plurality of tunnel diodes such as 14, each individually mounted in the outer ends of the wings. The tunnel diodes are positioned in place by conventional clamping screws 27, projecting through complementary screw threads formed in partition 22.

Now, considering the operation of the preferred embodiment just described, the cylindrical master cavity resonator 10 is excited in the $TE_{0,1,1}$ mode, and the radially extending resonators are excited in the TEM mode, the periodic structure being enegrized by the tunnel diodes in such manner that summation of their output powers is accomplished. This operation is described in further detail in the following explanation of the FIG. 5 embodiment. Suffice it for the present to state that the operations of the FIGS. 1 and 5 embodiments are electrically identical, except that in the FIG. 1 embodiment all of the tunnel diodes are conveniently coupled to a centrally located power source 16.

Figure 5:
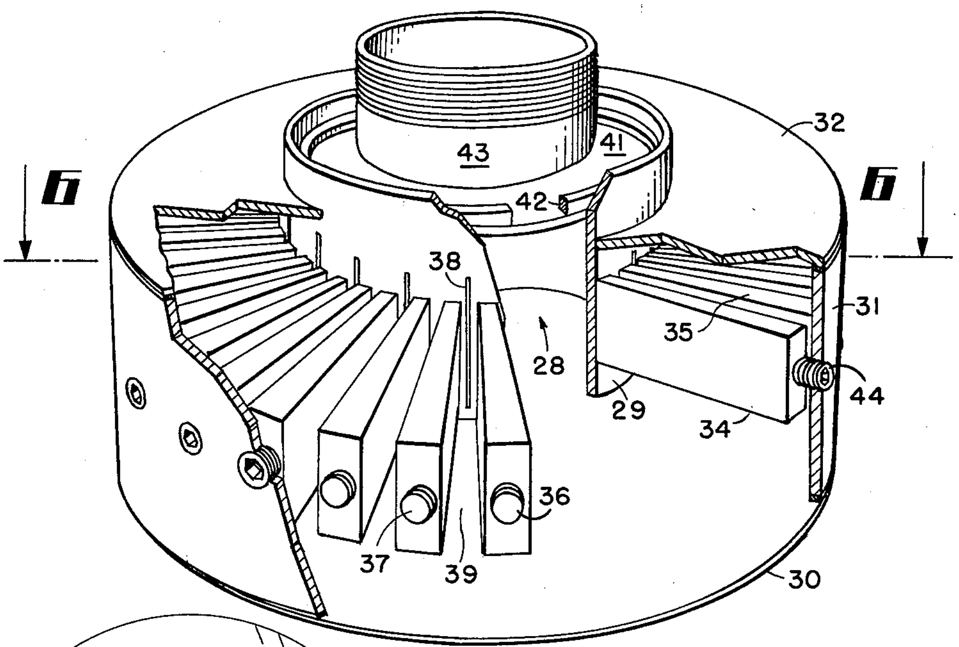
FIG. 5 is a perspective view, generally frontal but partially illustrative of the top, of another embodiment of multiple tunnel diode microwave oscillator per the invention, certain sections being broken away as an aid in exposition.
Figures 6, 7:
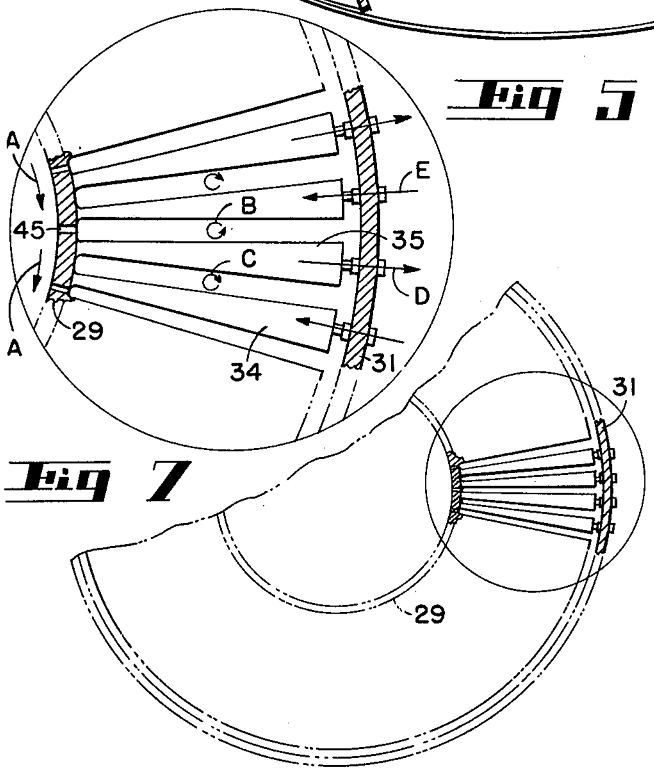
FIG. 6 is fragmentary sectional view in plan, taken along the section line 6—6 of FIG. 5.
FIG. 7 is an exploded view of the circled area of FIG. 6.

Referring now to the embodiment of the invention illustrated in FIGS. 5–7, there is provided a master cavity resonator 28 defined generally by the inner wall 29 and bottom 30 of a housing comprising an outer wall 31 and an inner wall 29 and an annular cap 32. An even-numbered plurality of metallic spoke-like wings 34, 35, etc., extend radially outwardly from the inner wall and terminate just short of the outer wall. These wings provide an even number of radially extending resonators in the spaces between them and are of lesser height than the inner wall and outer wall, so that the inner wall has margins extending above and below the wings. The radially extending resonators, even in number, are coupled together by tunnel diodes such as those numbered 36 and 37, the tunnel diodes being mounted on the outer ends of the wings. The inner wall 29 is formed with apertures, such as 38, in registry with alternate ones of the radial resonators, such as 39, to couple the radial resonators to the master cavity resonator 28. The master resonator is closed by a disc-like plunger 41 which again is slidably adjustably positioned, for purposes of tuning, within the upper portion of the inner wall 29. An annular washer 42 of lossy material is similar in structure and function to the element 20 of FIG. 1. The plunger 41 is suitably apertured and provided with a fitting or mechanical coupler 43 for power takeoff purposes.

An advantage of the FIG. 5 construction is that the tunnel diodes, clamped in place as by screws 44, are readily available from the outside of the housing structure. Additionally, the master cavity resonator 28 is in a favorable location. In the FIG. 5 embodiment the tunnel diodes are powered from any suitable source (not shown) such as solar cells, the tunnel diodes operating at low voltage.

It will be seen that in FIG. 5 the radially extending cavity resonator 39 is formed by the inner wall 29, the outer wall 31, and the opposing walls of the wings on which diodes 36 and 37 are mounted.

Referring now to FIG. 7 of the drawings, let it be understood that the radially extending resonators are excited in the TEM mode and the master cavity resonator in the $TE_{0,1,1}$ mode, in which event the electrical lines of force within the master cavity resonator, instantaneously, are as indicated by the arrows A. The behavoir of a cavity resonator operating in such mode is such that the electrical lines of force are in imaginary planes perpendicular to the central axis of the resonator, and the action of the electrical field is analogous to that of a reciprocating washing machine, the lines of force going in the direction indicated by the arrows A and then reversing, and so forth.

Now then, when the operation of the radial resonators is in the TEM mode, then the direction of the lines of electrical force in each radially extending resonator is opposite to the direction of the electrical force lines in the adjacent radially extending resonator. For example, in FIG. 7 the electrical lines of force B are counterclockwise, while the lines of force C are clockwise. In either case, however, the direction of the lines accords with the electrical path including arrows D, E, which extends from one wing—35, for example—through a tunnel diode, then through conductive wall 31, and back through the adjacent tunnel diode and adjacent wing to inner wall 29. It will be observed that the coupling slots 45 characterize only alternate ones of the resonators. This is for the reason, to give an illustration, that the electrical field B is in the same direction as the electrical field A as the fields pass the slot 45, so that the slot provides coupling. On the other hand, the electrical field C is in opposition to electrical field A, and there is therefore no coupling between A and C. Thus it will be seen that the invention provides a periodic structure which has a large number of appropriately located current modes, each of which is equipped with a tunnel diode generator.

It is reiterated that each pair of adjacent radially extending cavities oscillates in push-pull; at any instant in which the electrical field in one such resonator swings clockwise, the electrical field in the adjacent radially extending resonator swings counter-clockwise.

The master resonant cavity is characterized by a high Q, and it is analogous, frequency-wise, to a flywheel, the coupling via the slots to the radially extending resonators being such that all of the latter fall in step with the main flywheel. The master resonant cavity functions as an energy storage device and as the determinant of both frequency and phase of the electrical field. It will, of course, be understood that the entire device is loosely coupled to the utilization equipment (not shown).

Figure 8:
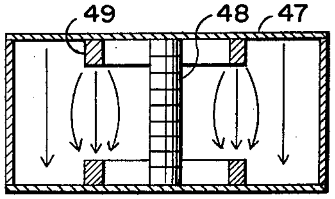
FIGS. 8 and 9 are elevational sectional structural views, generally schematic, illustrative of additional and non-preferred applications of the principles of the invention.

Reference is now made to FIG. 8. This is a cylindrical cavity 47 with a hypothetical center conductor 48, operating as a radial transmission line. The electric flux lines are all parallel to the axis. The magnetic flux lines are all circular and surround the axis. If one would unwrap the cylinder 47, its cross section would look like the $TE_{0,1}$ mode in a rectangular waveguide. To excite this mode in a cylindrical cavity, one must take certain important precautions because the cavity has the tendency to oscillate in the dominant or TEM mode. This mode is quite different from the $TE_{0,1}$ mode. A flat cavity with large diameter and short axial length will have the tendency to oscillate in the desired mode. This tendency can be enhanced by mode separators such as a circular ridge 49 somewhere less than half-way between the inner and outer diameter.

The exact location of the ridge 49 can be computed from the Hankel functions of the order 0 and the order 1. The difference between the argument of these functions must be $\pi/2$. For example, for an inner diameter of .23 unit, the ridge must be located at a distance of 1.33 units and the outer diameter must be located at a distance of 3.18 units. Another more extreme case is the following: for an inner diameter of .20, the ridge is at 8.0 and the outer diameter at 27.2. The center conductor in a cavity 47 of this sort has a uniform current. In all other modes this current would not be uniform. Now, one can replace the hypothetical center conductor with a stack of tunnel diodes 48. This will successfully excite this cavity, but there is still a great likelihood for undesired modes. The situation can be vastly improved by placing between each two tunnel diodes a disc such as 50 (FIG. 9) extending to the critical distance indicated above—namely, the distance of the ridge—and providing each of these discs with a small ridge, such as 51. The mode suppression will be improved, and, quite incidentally, these discs will constitute excellent heat sinks.

Each tunnel diode excites its own small radial cavity, which is coupled through a circular slot 52 with the main cylindrical cavity. Consequently, all tunnel diodes will "fall in step." D.C.-wise, the tunnel diodes are all connected in series.

Figure 9:
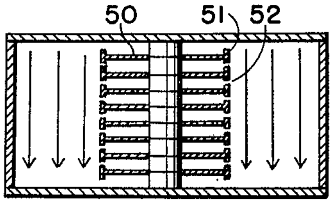

While the system of FIG. 9 is acceptable, the mode suppression leaves much to be desired. Therefore, the FIGS. 1 and 5 embodiments are preferred.

While there have been shown and described what are at present considered to be the preferred embodiments of the invention, it will be understood by those skilled in the art that various changes and modifications may be made therein without departing from the scope of the invention as defined by the appended claims.

I claim:

1. A microwave oscillator comprising, in combination:
a cylindrical master cavity resonator having a central axis,
a thermoelectric generator centered on said axis,
means including a plurality of metallic wings for defining a plurality of radially extending resonators,
the last-mentioned means further including a metallic partition formed with slots adjacent alternate ones of the radial resonators to couple the radial resonators to the master cavity resonator,
and a plurality of tunnel diodes individually mounted on the outer ends of said wings and energized by said thermoelectric generator for exciting said radially extending resonators.

2. An oscillator in accordance with claim 1, and adjustably positioned plunger means slidably secured within said master cavity resonator for tuning the same.

3. A microwave oscillator comprising, in combination:
a housing formed with an outer wall and an inner cylindrical partition which defines a master cavity resonator, a plurality of metallic wings between said inner partition and outer wall for defining a plurality of radially extending resonators, said partition being formed with slots adjacent alternate ones of the radial resonators to couple the radial resonators to the master cavity resonator, and a plurality of tunnel diodes individually mounted on the outer ends of said wings for exciting said radially extending resonators.

4. An oscillator in accordance with claim 3, and a concentric metallic disc slidably adjustable in said partition for tuning said master cavity resonator.

5. A microwave oscillator comprising, in combination:

a master cavity resonator comprising a cylindrical outer wall and a bottom and an adjustably positioned top disc, said disc being provided with an R.F. mechanical coupler;

a concentric partition within said resonator and extending from said bottom part of the way to said disc;

a cap for said partition;

a thermoelectric generator disposed concentrically of said partition;

a plurality of metallic spoke-like wings extending radially from said generator toward said partition and terminating short of said partition, said wings being of lesser height than the partition so that the partition has margins extending above and below said wings, the wings providing an even number of radially extending resonators in the spaces between them;

and individual tunnel diodes mounted on the outer ends of said wings to energize the radial resonators;

said partition being formed with slots in registry with alternate ones of said radial resonators to couple them to the master cavity resonator;

all of said diodes being energized by said thermoelectric generator.

6. A microwave oscillator comprising, in combination:

a housing comprising a cylindrical outer wall and a bottom;

a concentric cylindrical inner wall and a top between said outer and inner walls;

a tuning disc having a mechanical coupler fitting and adjustably slidably positioned within said inner wall;

said disc and inner wall and bottom comprising a master cavity resonator;

a plurality of metallic spoke-like wings extending radially from said inner wall toward, but terminating short of, said outer wall, said wings providing an even number of radially extending resonators in the spaces between them, said wings being of lesser height than the inner wall so that the inner wall has margins extending above and below said wings;

and tunnel diodes mounted on the outer ends of said wings for exciting said radially extending resonators;

said inner wall being formed with apertures in registry with alternate ones of said radial resonators to couple them to the master cavity resonator.

No references cited.

ROY LAKE, *Primary Examiner.*